United States Patent [19]

Takahata et al.

[11] Patent Number: 5,743,748
[45] Date of Patent: *Apr. 28, 1998

[54] EMULATOR PROBE

[75] Inventors: Youichi Takahata; Toshihiko Sugahara, both of Hyogo, Japan

[73] Assignees: Mitsubishi Electric Semiconductor Software Co., Ltd., Itami; Mitsubishi Denki Kabushiki Kaisha, Tokyo, both of Japan

[*] Notice: The term of this patent shall not extend beyond the expiration date of Pat. No. 5,571,201.

[21] Appl. No.: 519,811

[22] Filed: Aug. 25, 1995

[30] Foreign Application Priority Data

Apr. 4, 1995 [JP] Japan ................. 7-078951

[51] Int. Cl.⁶ ................. H01R 23/72; H01R 9/09
[52] U.S. Cl. ................. 439/71; 439/482; 439/912
[58] Field of Search ................. 439/912.1, 68, 439/482, 70, 71, 72, 73

[56] References Cited

U.S. PATENT DOCUMENTS

| | | | |
|---|---|---|---|
| 4,564,251 | 1/1986 | Hansen et al. | 439/912.1 X |
| 4,917,613 | 4/1990 | Kabadi | 439/67 OR |
| 5,205,741 | 4/1993 | Steen et al. | 439/912.1 X |
| 5,266,059 | 11/1993 | Taylor | 439/912.1 OR |
| 5,571,021 | 11/1996 | Kawabe et al. | 439/71 |

Primary Examiner—Gary F. Paumen
Attorney, Agent, or Firm—Oblon, Spivak, McClelland, Maier & Neustadt, P.C.

[57] ABSTRACT

An emulator probe accelerates the efficiency of program debugging work with an emulator. The emulator probe includes an emulator coupling device in which lead terminals are soldered on string-like cut-out sections provided on the sides of a board having the same dimensions as a package molding portion of a microcomputer. As required, the emulator coupling device or a microcomputer is mounted on an IC socket provided on a target board.

10 Claims, 5 Drawing Sheets

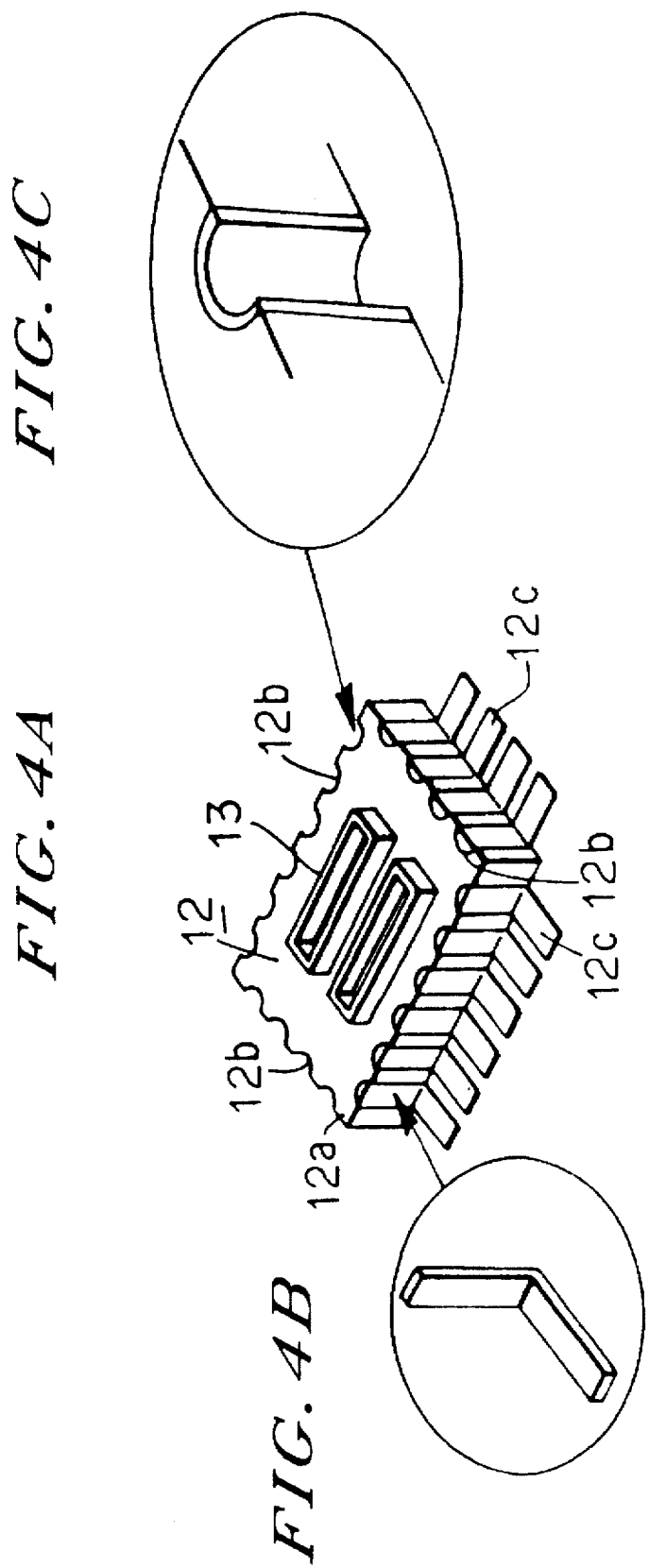

30%

50%

70%

90%

EMULATOR PROBE

BACKGROUND OF THE INVENTION

1. Field of the Invention

The present invention relates to a probe for coupling an in-circuit emulator which assists program development in a microcomputer or ASIC having that function with a circuit board on which the microcomputer or the like is to be mounted.

2. Description of the Prior Art

FIG. 1 is a perspective view showing a conventional emulator probe together with a microcomputer, an IC socket and a circuit board. FIG. 2 is a sectional view showing the state in which the conventional emulator probe is coupled with a circuit board. Referring to FIGS. 1 and 2, reference numeral 1 designates a target board which is a circuit board on which a microcomputer is to be mounted, numeral 2 designates foot patterns which are printed on the target board 1 and on which a microcomputer is to be mounted, numeral 3 designates an LCC socket in which a connector 5 on a board for connecting cable 4 or an LCC packaged microcomputer 8 is to be mounted, numeral 4 designates a board for connecting cable which is electrically connected to an in-circuit emulator 6 and has a connector 5 which is to be coupled with the LCC socket 3, and numeral 5 designates a connector provided on the board for connecting cable 4.

Reference numeral 6 designates an in-circuit emulator for evaluating microcomputer programs, numeral 7 designates a signal transmitting cable for coupling the in-circuit emulator 6 with the board for connecting cable, numeral 8 designates an LCC packaged microcomputer which is sealed in an LCC package which is a ceramic molding, and numeral 9 designates a QFP packaged microcomputer which is sealed in a QFP. After program evaluation is completed with the in-circuit emulator 6, the QFP packaged microcomputer 9 is soldered onto the foot patterns 2 on which the microcomputer is to be mounted, so that it is fit to the target board 1.

Then, the operation of this invention will be described. Generally, in program development for the microcomputer, it is necessary to debug designed programs. Before the QFP packaged microcomputer 9 is mounted on the target board 9, the in-circuit emulator 6 is connected to the board 9 and used for debugging the designed program.

It is difficult to configure the shape of the pins provided on the probe of the in-circuit emulator 6 so that it matches the shape of the QFP. If such a shape is configured, the pins are likely to be damaged, so that the maintenance thereof is not easy to achieve. Thus, the shapes of the probes of the in-circuit emulators 6 have been configured to be of a shape relatively facilitating the maintenance thereof, for example, in such a manner that the shapes of the probes match the shapes of the LCC packages.

Additionally, the in-circuit emulators 6 are often used each time when a new program is designed. Therefore, the probe of the in-circuit emulator 6 are not permitted to be soldered directly to the target board 1. Thus, when debugging with the in-circuit emulator 6, the LCC socket 3 is soldered onto the target board 1 in order to couple the in-circuit emulator 6 with the target board 1. Then, the connector 5 on the board for connecting cable 4 connected to the in-circuit emulator 6 is inserted into the LCC socket 3 thereby coupling the in-circuit emulator 6 with the target board 1.

After program evaluation is completed with the in-circuit emulator 6, further program evaluation is achieved with a microcomputer chip being actually mounted. Namely, the board for connecting cable 4 is removed from the LCC socket 3. Then, the LCC packaged microcomputer 8 is mounted on the LCC socket 3. In this state, the target board 1 is evaluated.

However, the LCC packaged microcomputer 8 costs much for its production because it is a ceramic molding. Therefore, upon mass production of the target board 1, instead of the LCC packaged microcomputer 8, the QFP packaged microcomputer 9 which costs less than the former is often used.

Thus, it is necessary to carry out program evaluation with the QFP packaged microcomputer 9 being actually mounted on the target board so as to coincide with the condition of mass production. That is, program evaluation is performed also in the state in which the QFP packaged microcomputer 9 is soldered on the target board 1 after the soldered LCC socket 3 is removed from the target board 1.

If bugs or the like are found in a program at this stage, the soldered QFP packaged microcomputer 9 is removed from the target board 1 and then the LCC socket 3 is soldered onto the target board 1. Then, the program is evaluated again with the in-circuit emulator 6.

Because the connector 5 of the board for connecting cable 4 is inherent of the in-circuit emulator, it is usually produced by resin molding. Further, it is necessary to develop an LCC packaged microcomputer 8 and LCC socket 3 which match the shape of the QFP packaged microcomputer 9. Generally, the LCC socket 3 is produced by resin molding. Because, in development of circuit boards on which microcomputer is to be mounted, the LCC packaged microcomputer 8 and the LCC socket 3 which will not be used at mass production stage must be prepared, the cost required for the development increases.

If bugs are found in a program at the stage in which the QFP packaged microcomputer 9 is mounted on the target board 1, the soldered QFP packaged microcomputer 9 is removed from the target board 1 and then the LCC socket 3 is soldered again onto the target board 1. After that, program evaluation must be performed with the in-circuit emulator 6. Consequently, the efficiency of debugging work lowers. Additionally, the reliability of the foot patterns 2 for mounting the microcomputer is reduced by repeated soldering works.

SUMMARY OF THE INVENTION

An object of the present invention is to solve the above-described problems and to provide a program development environment in which the necessity of use of any resin molding is eliminated to suppress increases of the development cost of new circuit board and debugging can be carried out without soldering a QFP packaged microcomputer onto a target board.

An emulator probe according to the present invention contains an emulator coupling device in which lead terminals are soldered on string-like cut-out sections provided on the sides of a circuit board having the same dimensions as the package molding portion of a microcomputer.

An emulator probe according to another aspect of the present invention contains an emulator coupling device in which lead terminals are soldered in the through holes formed on the peripheral of the circuit board having the same dimensions as the package molding portion of the microcomputer.

BRIEF DESCRIPTION OF THE DRAWINGS

FIG. 4 is an enlarged perspective view showing the emulator coupling device.

DETAILED DESCRIPTION OF THE PREFERRED EMBODIMENTS

Figure 1:
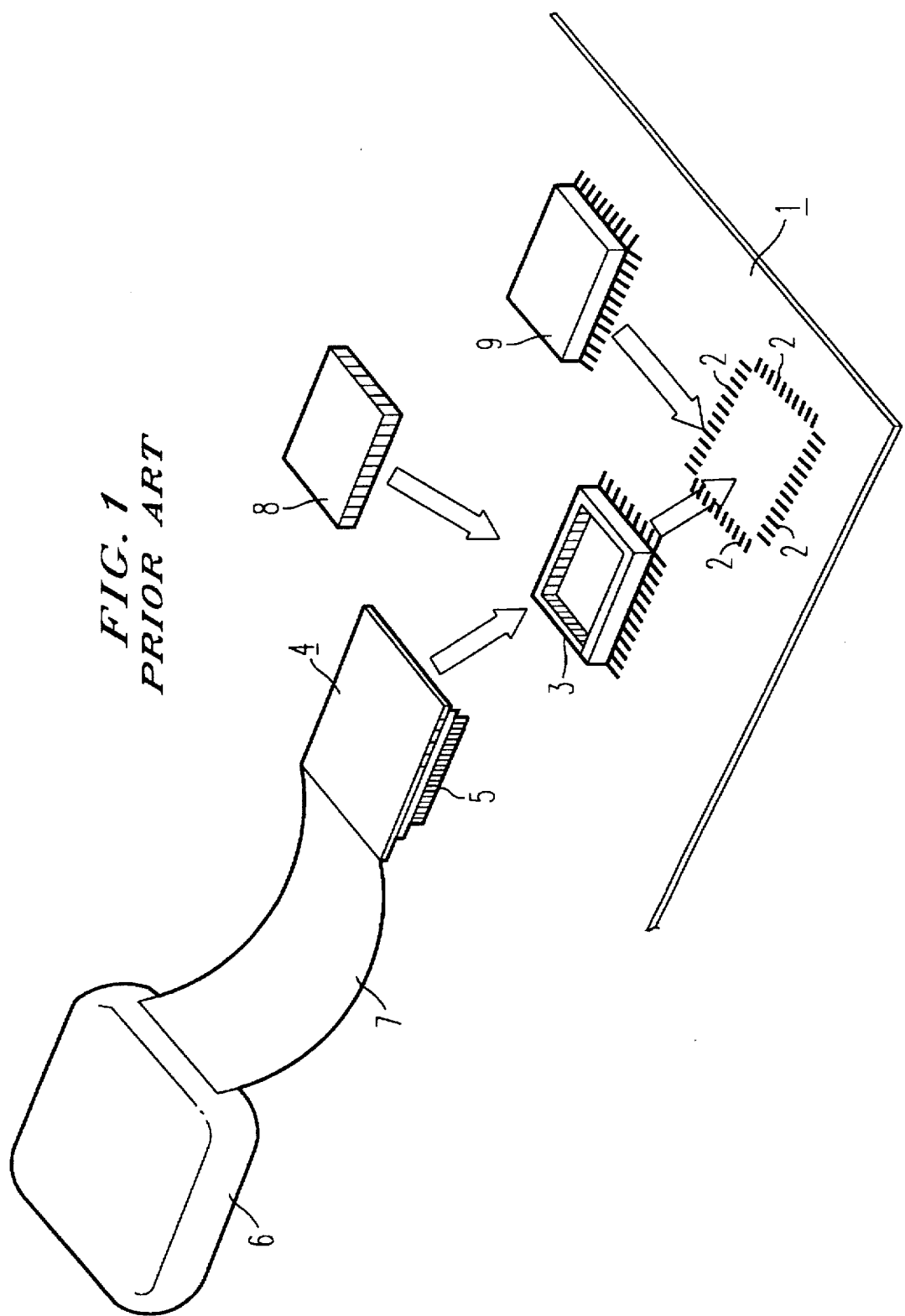
FIG. 1 is a perspective view showing a conventional emulator probe together with a microcomputer, an IC socket and a circuit board.
Figure 2:
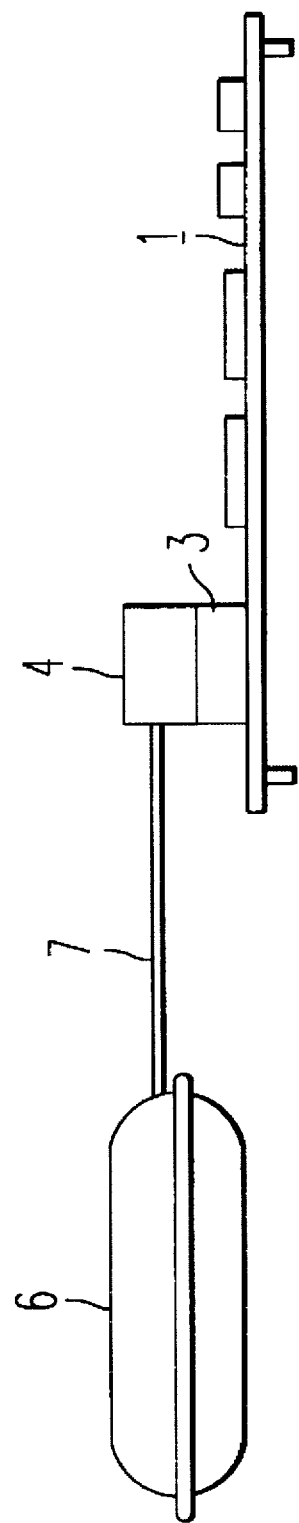
FIG. 2 is a sectional view showing the state in which a conventional emulator probe is coupled with the circuit board.
Figure 3:
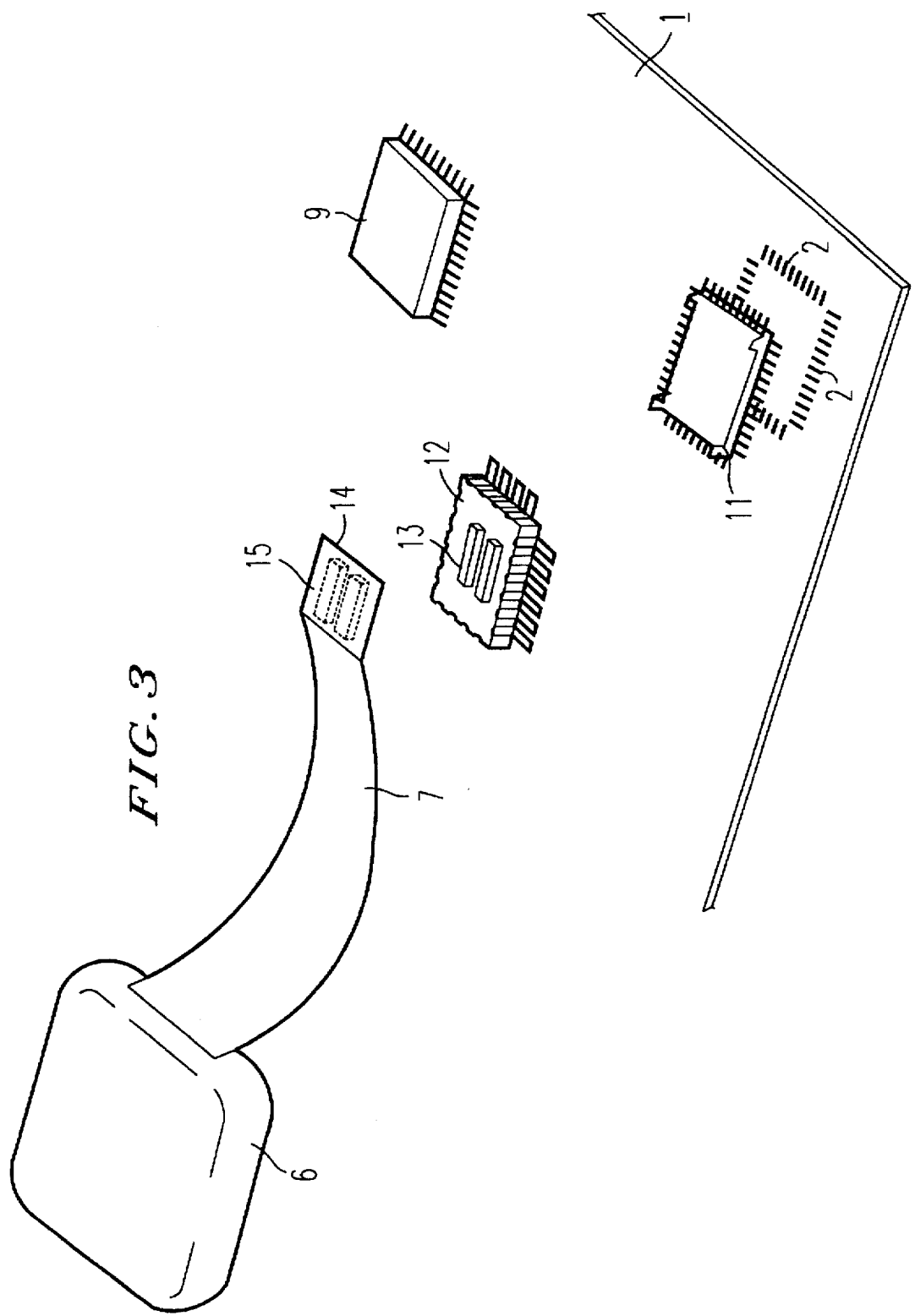
FIG. 3 is a perspective view showing an emulator coupling device according to an embodiment of this invention together with a microcomputer, an IC socket and a circuit board.
Figure 5A:
FIGS. 5A–5D are plan views showing the shapes of the openings of respective through holes.
Figure 5B:
Figure 5C:
Figure 5D:
Figure 6A:
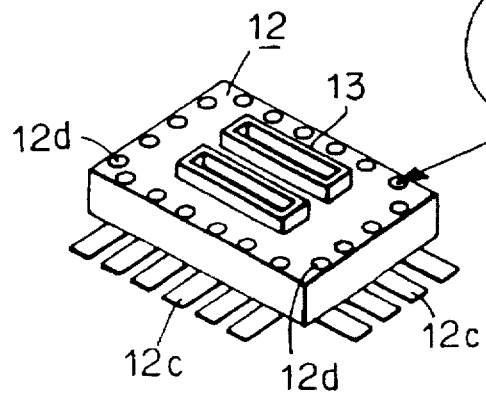
FIG. 6 is an enlarged perspective view showing the emulator coupling device.
Figure 6B:
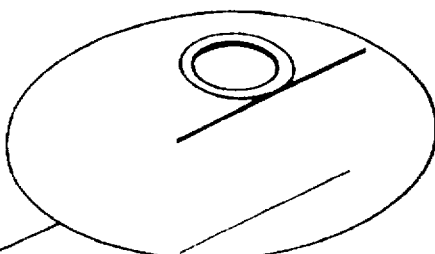

FIG. 3 is a perspective view showing an emulator coupling device according to an embodiment of the present invention together with a microcomputer, an IC socket and a circuit board. FIG. 4 is an enlarged perspective view of the emulator coupling device. Referring to FIGS. 3 and 4, reference numeral 11 designates an IC socket which will be soldered onto the foot patterns 2 and on which a QFP packaged microcomputer 9 is to be mounted. Numeral 12 designates an emulator coupling device which is to be mounted onto the IC socket 11 instead of the QFP packaged microcomputer 9 when an in-circuit emulator 6 is used. Hereinafter, the emulator coupling device will be referred to as a dummy IC. The dummy IC 12 includes a printed circuit board 12a, through holes 12b which are semicircular holes formed on the sides of the printed circuit board 12a, lead terminals 12c soldered on the through holes 12b and relay connectors 13 fit to the printed circuit board 12a. The printed circuit board 12a has the same dimensions as the package molding portion (portion excluding the lead terminals) of the QFP packaged microcomputer 9. The relay connector 13 has terminals electrically connected to the through holes 12b of the dummy IC 12.

Reference numeral 14 designates a board (pod portion) for connecting cable 7, which is electrically coupled with the in-circuit emulator 6, to the dummy IC 12 via connectors 15 which are to be coupled with the relay connectors 13. The connectors 15 are fit to the bottom of the board (pod portion) 14.

The operation of this invention will be described. When program evaluation is performed, a commercially marketed IC socket 11 which coincides with the QFP packaged microcomputer 9 which is used at mass production stage is soldered onto the foot patterns 2. For example, if the QFP packaged microcomputer 9 is a 20-pin IC, an IC socket which fits to 20 pins is soldered thereon.

Next, the dummy IC 12 which contains the printed circuit board 12a of the same dimensions as the package molding portion (portion excluding the lead terminals) of the QFP packaged microcomputer 9 is prepared. As shown in FIG. 4, the dummy IC 12 includes semi-circular through holes 12b which are formed on the sides of the printed circuit board 12a having the same dimensions as the package molding portion of the QFP packaged microcomputer 9. The printed circuit board 12a has conductor patterns formed thereon to electrically connect each terminal of the relay connectors 13 to respective corresponding through holes.

If the shape of the opening of the through holes is semi-circular, they can be formed easily by conventional printed circuit board production technology. For example, such through holes can be formed by use of a drill or the like. That is, if the shape of the through holes 12b is semi-circular, string-like cut-out sections can be formed easily. On the other hand, the shape of the opening does not have to be half a proper circle (50% semi-circle) and is permitted to be of a shape similar to a semi-circle, that is a shape of 30%, 50% or 90% of a proper circle.

Further, the lead terminal 12c is soldered onto each of the through holes. The number of the lead terminals 12c are the same as that of the lead terminals of the QFP packaged microcomputer 9. The dimensions of that portion of the dummy IC 12 formed in the above-described manner excluding the lead terminals are the same as the dimensions of the package molding portion of the QFP packaged microcomputer 9. Therefore, the dummy IC 12 can be mounted on the IC socket 11 as in the case of the QFP packaged microcomputer 9.

When program evaluation is carried out with the in-circuit emulator 6, the dummy IC 12 is mounted on the IC socket 11 instead of the QFP packaged microcomputer 9. As shown in FIG. 4, the relay connectors 13 having terminals electrically coupled with the through holes 12b are provided on the top surface of the dummy IC 12. The bottom surface of the board for connecting cable 14 has connectors 15 which are electrically connected to the in-circuit emulator 6 and can be coupled with the relay connectors 13. Coupling the relay connectors 13 with the connectors 15 of the board for connecting cable 14 makes the in-circuit emulator 6 to be electrically coupled with the target board 1. Thus, it is possible to carry out program evaluation with the in-circuit emulator 6.

After program evaluation with the in-circuit emulator 6 is completed, the dummy IC 12 is removed from the IC socket 11. Then, the QFP packaged microcomputer 9 is mounted on the IC socket 11 and program evaluation is carried out with the microcomputer being actually mounted.

If bugs in a program are found at this stage, the QFP packaged microcomputer 9 is removed from the IC socket 11. Then, the dummy IC 12 is mounted on the IC socket 11 and program evaluation with the in-circuit emulator 6 is carried out.

As described above, debugging can be performed without soldering the probe of the in-circuit emulator 6 and the QFP packaged microcomputer 9 onto the target board 1. Consequently, the efficiency of debugging work increases. When program evaluation is carried out with the microcomputer being actually mounted, the QFP packaged microcomputer 9 is not soldered. Thus, it is possible to prevent loss of reliability of the foot patterns 2, due to repeated soldering, on which the microcomputer is to be mounted.

Because resin molding (LCC socket 3 and connector 5 of the board for connecting cable 4) does not need to be prepared and further, the general IC socket 11, the connector 13 and the connector 15 are available, it is possible to suppress the cost required for development of the target board and programs.

Although the probe of the in-circuit emulator which assists program development for the microcomputers is described above, it is possible to apply this embodiment to the case of probes of in-circuit emulators for gate arrays, ASIC or the like.

Although the semi-circular through holes 12 are formed on the sides of the printed circuit board 12a in the above-described embodiment, it is permissible to form completely circular through holes 12d on the peripheral of the printed circuit board 12a. In this case, because the lead terminals 12c can be soldered in the state in which they are inserted in the through holes 12d, soldering of the lead terminals 12c onto the foot patterns 2 is facilitated.

As described above, according to this invention, debugging can be carried out without soldering the probe of the in-circuit emulator and the microcomputer onto the target board, thereby improving the efficiency of debugging work. Additionally, it is possible to prevent deterioration of the foot patterns on which the microcomputer is to be mounted. Further, because resin molding (LCC socket and connector of the board for connecting cable) does not have to be prepared, it is possible to suppress development cost.

If the shape of the opening provided on the cut-out section of the dummy IC is semi-circular, such cut-out sections can be formed with conventional printed circuit board production technology, so that the string-like cut-out sections can be formed easily.

What is claimed is:

1. An in-circuit emulator coupling device for coupling an in-circuit emulator, which assists program development, with a main circuit board on which an integrated circuit for executing said program is mounted, comprising:

a coupling circuit board having external dimensions corresponding to external dimensions of said integrated circuits;

lead terminals for coupling said in-circuit emulator coupling device with said main circuit board at a location where said integrated circuit for executing said program is to be mounted;

relay connectors provided on said coupling circuit board for coupling with a pod portion of an in-circuit emulator; and conductor patterns for electrically connecting said relay connectors to said lead terminals.

2. An in-circuit emulator coupling device according to claim 1, wherein a number of said lead terminals is equivalent to a number of terminals of the integrated circuit.

3. The in-circuit emulator coupling device according to claim 1, wherein said relay connectors are provided on a top of said coupling circuit board.

4. An emulator probe comprising:

an IC socket which is to be soldered on foot patterns formed on a main circuit board for mounting an integrated circuit;

an in-circuit emulator coupling device comprising, a coupling circuit board having external dimensions corresponding to external dimensions of said integrated circuit, including through holes on sides of said coupling circuit board, relay connectors on said coupling circuit board, and lead terminals bonded to said through holes; and a pod portion which is electrically coupled to an in-circuit emulator and is connected to said in-circuit emulator coupling device via pod portion connectors attached to said pod portion and fitted to said relay connectors.

5. An emulator probe according to claim 4, wherein the through holes in the in-circuit emulator coupling device are grooves on said sides of said coupling circuit board which extend from a top plane of the coupling circuit board to a bottom plane of the coupling circuit board.

6. An emulator probe according to claim 4, wherein the through holes in the in-circuit emulator coupling device are penetrating holes which are provided at a periphery of the coupling circuit board.

7. An emulator probe according to claim 5, wherein the through holes in the in-circuit emulator coupling device have semi-circular shapes when viewed from a top thereof.

8. The in-circuit emulator coupling device according to claim 4, wherein said relay connectors are provided on a top of said coupling circuit board.

9. An in-circuit emulator, comprising:

an in-circuit emulator coupling device comprising, relay connectors for receiving connectors, and lead terminals for connection to a main circuit board where an integrated circuit is to be mounted;

a pod portion having connectors for connecting to said relay connectors of said in-circuit emulator coupling device;

an emulator for emulating operation of said integrated circuit; and a cable connecting said emulator to said pod portion.

10. An in-circuit emulator according to claim 9, wherein said lead terminals are of a flatpack type.

* * * * *